(12) United States Patent  (10) Patent No.: US 9,741,578 B2
Yasunishi et al.  (45) Date of Patent: Aug. 22, 2017

(54) MANUFACTURING METHOD OF SEMICONDUCTOR DEVICE

(71) Applicant: TOYODA GOSEI CO., LTD., Kiyosu-shi (JP)

(72) Inventors: Kota Yasunishi, Kiyosu (JP); Tohru Oka, Kiyosu (JP); Noriaki Murakami, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/613,194

(22) Filed: Feb. 3, 2015

(65) Prior Publication Data

US 2015/0228493 A1 Aug. 13, 2015

(30) Foreign Application Priority Data

Feb. 12, 2014 (JP) ................. 2014-024228

(51) Int. Cl.

| H01L 21/285 | (2006.01) |
|---|---|
| H01L 29/47 | (2006.01) |
| H01L 29/45 | (2006.01) |
| H01L 21/306 | (2006.01) |
| H01L 29/20 | (2006.01) |

(52) U.S. Cl.
CPC .. *H01L 21/28575* (2013.01); *H01L 21/28581* (2013.01); *H01L 29/2003* (2013.01); *H01L 29/452* (2013.01); *H01L 29/475* (2013.01); *H01L 21/30617* (2013.01)

(58) Field of Classification Search
CPC ......... H01L 21/28581; H01L 21/28575; H01L 21/30617; H01L 29/475
See application file for complete search history.

(56) References Cited

U.S. PATENT DOCUMENTS

| 5,811,319 A | 9/1998 | Koike et al. |
| 2001/0054763 A1 | 12/2001 | Nido et al. |
| 2006/0134431 A1* | 6/2006 | Yasuda ................. B32B 15/082 428/411.1 |
| 2008/0198886 A1* | 8/2008 | Michiue ................. B82Y 20/00 372/44.011 |
| 2008/0254562 A1* | 10/2008 | Yajima .................... H01L 33/22 438/46 |
| 2008/0273562 A1 | 11/2008 | Hasegawa et al. |
| 2012/0205665 A1* | 8/2012 | Nam .................... H01L 29/2003 257/76 |

(Continued)

FOREIGN PATENT DOCUMENTS

| CN | 102916100 | * 2/2013 | ............. H01L 33/14 |
| EP | 2 800 152 A1 | 11/2014 | |

(Continued)

*Primary Examiner* — Caleb Henry
*Assistant Examiner* — Mounir Amer
(74) *Attorney, Agent, or Firm* — McGinn IP Law Group, PLLC

(57) ABSTRACT

A technique of reducing the contact resistance between a semiconductor substrate and a metal layer is provided. A manufacturing method of a semiconductor device comprises a process of forming a metal layer on an N surface of a nitride semiconductor substrate. The process of forming the metal layer includes a first process of forming a metal layer by sputtering at a film formation rate controlled to 4 nm/minute or lower.

22 Claims, 3 Drawing Sheets

(56) References Cited

U.S. PATENT DOCUMENTS

| | | | | |
|---|---|---|---|---|
| 2012/0214267 A1* | 8/2012 | Wang | ............... | H01L 33/22 |
| | | | | 438/29 |
| 2013/0161685 A1* | 6/2013 | Lee | ............... | H01L 33/52 |
| | | | | 257/100 |
| 2014/0318592 A1* | 10/2014 | Sztein | ............... | H01L 35/22 |
| | | | | 136/236.1 |
| 2015/0187990 A1* | 7/2015 | Yin | ............... | H01L 33/40 |
| | | | | 257/88 |

FOREIGN PATENT DOCUMENTS

| | | | |
|---|---|---|---|
| JP | 62-136018 A | 6/1987 |
| JP | 2967743 B2 | 10/1999 |
| JP | 2004-071657 A | 3/2004 |
| JP | 3773282 B2 | 5/2006 |
| JP | 2007-508093 A | 4/2007 |
| JP | 2007-324549 A | 12/2007 |
| JP | 2009-200332 A | 9/2009 |
| JP | 2010-225767 A | 10/2010 |
| JP | 4842827 B2 | 12/2011 |
| JP | 2013-138139 A | 7/2013 |
| WO | WO 2005/036466 A1 | 4/2005 |

* cited by examiner

MANUFACTURING METHOD OF SEMICONDUCTOR DEVICE

CROSS-REFERENCE TO RELATED APPLICATION

The present application claims priority from Japanese patent applications No. 2014-24228 filed on Feb. 12, 2014, the entirety of disclosures of which is hereby incorporated by reference into this application.

FIELD OF INVENTION

The invention relates to a manufacturing method of a semiconductor device.

DESCRIPTION OF RELATED ART

A known method of reducing the contact resistivity between an N surface of a nitride semiconductor substrate such as gallium nitride (GaN) substrate and an electrode makes a silicon dioxide ($SiO_2$) film deposit on the N surface, removes the silicon dioxide film and subsequently forms an electrode (JP 2007-508093).

SUMMARY

The technique described in JP 2007-508093, however, the process of removing the silicon dioxide film and the process of forming the electrode are separate processes. Carbon (C) which may have contribution to increase the contact resistance may adsorb on the N surface between these two separate processes. The technique described in JP 2007-508093 is thus not sufficient as the method of reducing the contact resistivity. This known technique needs the process of removing the silicon dioxide film after deposition of the silicon dioxide film on the N surface and accordingly has the problem of increased manufacturing cost. Other needs in the prior art semiconductor device include downsizing, resource saving, easy manufacture, accuracy of manufacture and improvement of workability.

In order to solve at least part of the problems described above, the invention may be implemented by aspects described below.

(1) According to one aspect of the invention, there is provided a manufacturing method of a semiconductor device. The manufacturing method of the semiconductor device comprises: forming a metal layer on an N surface of a nitride semiconductor substrate, wherein the forming the metal layer includes a first process of forming a metal layer by sputtering at a film formation rate controlled to 4 nm/minute or lower. The manufacturing method of the semiconductor device of this aspect reduces the contact resistance between the semiconductor substrate and the metal layer.

(2) According to one embodiment of the manufacturing method of the semiconductor device of the above aspect, the film formation rate in the first process may be equal to or higher than 0.01 nm/minute. The manufacturing method of the semiconductor device of this aspect further improves the productivity.

(3) According to one embodiment of the manufacturing method of the semiconductor device of any of the above aspect, the nitride semiconductor substrate may be mainly made of gallium nitride. The manufacturing method of the semiconductor device of this aspect further reduces the contact resistance between the semiconductor substrate and the metal layer.

(4) According to one embodiment of the manufacturing method of the semiconductor device of any of the above aspect, the first process may include a process of forming a metal layer made of titanium. The manufacturing method of the semiconductor device of this aspect further reduces the contact resistance between the semiconductor substrate and the metal layer.

(5) According to one embodiment of the manufacturing method of the semiconductor device of any of the above aspect, the forming the metal layer may include a process of forming a metal layer mainly made of aluminum, after the process of forming the metal layer made of titanium. The manufacturing method of the semiconductor device of this aspect further reduces the contact resistance between the semiconductor substrate and the metal layer.

(6) According to one embodiment, the manufacturing method of the semiconductor device of any of the above aspect may further comprise performing wet etching on the N surface of the nitride semiconductor substrate, prior to the first process. The manufacturing method of the semiconductor device of this aspect further reduces the contact resistance between the semiconductor substrate and the metal layer.

(7) According to one embodiment of the manufacturing method of the semiconductor device of any of the above aspect, the wet etching may be performed using a solution containing TMAH. The manufacturing method of the semiconductor device of this aspect further reduces the contact resistance between the semiconductor substrate and the metal layer.

(8) According to one embodiment of the manufacturing method of the semiconductor device of any of the above aspect, the wet etching may be performed using a solution having temperature of not higher than 60° C. The manufacturing method of the semiconductor device of this aspect further reduces the contact resistance between the semiconductor substrate and the metal layer.

(9) According to one embodiment of the manufacturing method of the semiconductor device of any of the above aspect, the wet etching may be performed for a time of not shorter than 10 seconds. The manufacturing method of the semiconductor device of this aspect performs the wet etching for the time of not shorter than 10 seconds, thus further reducing the contact resistance between the semiconductor substrate and the metal layer.

(10) According to one embodiment of the manufacturing method of the semiconductor device of any of the above aspect, the wet etching may be performed for a time of not longer than 300 seconds. The manufacturing method of the semiconductor device of this aspect performs the wet etching for the time of not longer than 300 seconds, thus suppressing a decrease in yield.

(11) According to one embodiment, the manufacturing method of the semiconductor device of any of the above aspect may further comprise performing heat treatment, after the forming the metal layer. The manufacturing method of the semiconductor device of this aspect further reduces the contact resistance between the semiconductor substrate and the metal layer.

(12) According to one embodiment of the manufacturing method of the semiconductor device of any of the above aspect, the heat treatment may be performed at temperature of not lower than 350° C. and not higher than 550° C. The manufacturing method of the semiconductor device of this aspect further reduces the contact resistance between the semiconductor substrate and the metal layer.

(13) According to one embodiment of the manufacturing method of the semiconductor device of any of the above aspect, the forming the metal layer may include a second process of forming a metal layer by sputtering at a film formation rate controlled to be higher than 4 nm/minute, after the first process. The manufacturing method of the semiconductor device of this aspect improves the productivity.

All the plurality of components included in the aspect of the invention described above are not essential, but some components among the plurality of components may be appropriately changed, omitted or replaced with other components or part of the limitations may be deleted, in order to solve part or all of the problems described above or in order to achieve part or all of the advantageous effects described herein. In order to solve part or all of the problems described above or in order to achieve part or all of the advantageous effects described herein, part or all of the technical features included in one aspect of the invention described above may be combined with part or all of the technical features included in another aspect of the invention described later to provide still another independent aspect of the invention.

The invention may be implemented by any of various aspects other than the manufacturing method of the semiconductor device: for example, a semiconductor device or power conversion equipment including the semiconductor device.

The above aspect of the invention reduces the contact resistivity between a semiconductor substrate and a metal layer.

DESCRIPTION OF EMBODIMENTS

A. First Embodiment

A1. Structure of Semiconductor Device 100

Figure 1:
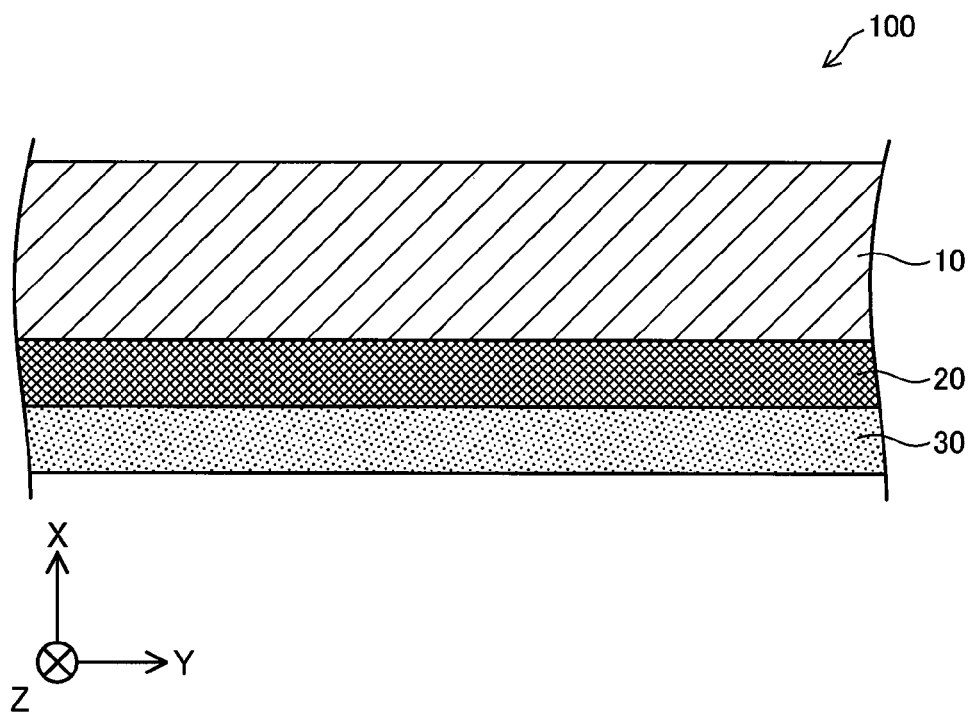
FIG. 1 is a cross sectional view schematically illustrating the structure of a semiconductor device according to a first embodiment.

FIG. 1 is a cross sectional view schematically illustrating the structure of a semiconductor device 100 according to a first embodiment. FIG. 1 illustrates part of the cross section of the semiconductor device 100 according to the embodiment. FIG. 1 is a diagram for the purpose of illustrating the technical feature of the semiconductor device 100 in an easily understandable manner and does not represent the thicknesses of the respective layers correctly. XYZ axes orthogonal to one another are also shown in FIG. 1, in order to facilitate the explanation. In the description herein, thickness of a layer means thickness in an X-axis direction.

The semiconductor device 100 of this embodiment is SBD (Schottky Barrier Diode). The semiconductor device 100 includes a semiconductor layer 10, a titanium layer 20 and an aluminum layer 30.

The semiconductor layer 10 is mainly made of a nitride semiconductor. Available examples of the nitride semiconductor include aluminum nitride, gallium nitride and indium nitride. The semiconductor layer 10 may additionally include, for example, silicon (Si) or germanium (Ge) as the donor impurity. This embodiment uses gallium nitride for the semiconductor. In the description herein, the semiconductor layer 10 is also called semiconductor substrate 10. Being mainly made of gallium nitride (GaN) means containing 90% or more of gallium nitride (GaN) at the mole fraction.

Gallium nitride is advantageous over other semiconductors by (i) high thermal conductivity to provide excellent heat radiation, (ii) operability at high temperatures, (iii) high saturation velocity of electrons and (iv) high dielectric breakdown voltage.

The titanium layer 20 is formed to cover one surface of the semiconductor layer 10. The titanium layer 20 is a layer made of titanium. In this embodiment, the thickness of the titanium layer 20 is set to 30 nm.

The aluminum layer 30 is formed on the titanium layer 20 on the opposite side (−X direction side) to the semiconductor layer 10. The aluminum layer 30 is a layer mainly made of aluminum. In this embodiment, the aluminum layer 30 is a single layer made of only aluminum and has a thickness of 300 nm. The aluminum layer may be made of a compound (alloy) containing 90% or more of aluminum. The aluminum layer of such a compound provides the advantageous effects substantially equivalent to those of the aluminum pure layer. Examples of the compound (alloy) include Al—Si and Al—Cu.

This structure ensures good ohmic contact between the semiconductor layer 10 and the metal layer (titanium layer 20 and aluminum layer 30). A manufacturing method described in detail below reduces the contact resistance between the semiconductor layer 10 and the metal layer (titanium layer 20 and aluminum layer 30).

A2. Manufacturing Method of Semiconductor Device 100

Figure 2:
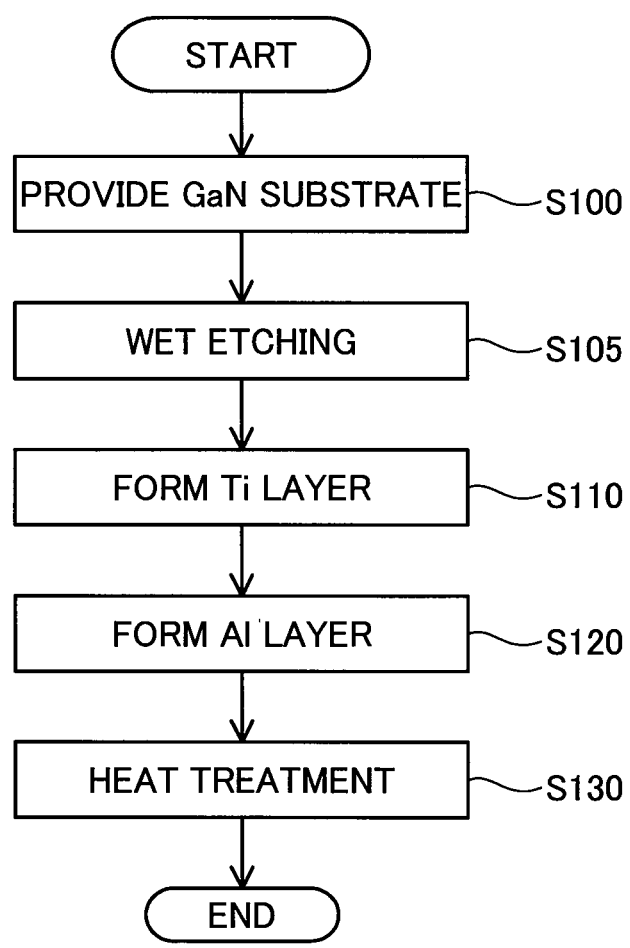
FIG. 2 is a flowchart showing a manufacturing method of the semiconductor device according to the first embodiment.

FIG. 2 is a flowchart showing a manufacturing method of the semiconductor device 100 according to the first embodiment. At step S100, the method provides the semiconductor substrate 10.

The semiconductor substrate 10 has been subjected to pre-treatment. The pre-treatment includes (i) formation of concavities and convexities on the semiconductor substrate 10; (ii) formation of a source electrode, (iii) formation of an insulating film, (iv) dry etching, (v) formation of a drain electrode, (vi) formation of a gate electrode and (vii) heat treatment.

At step S105, the method performs wet etching on an N surface of the semiconductor substrate 10.

The "N surface" is described. Gallium (Ga) atoms are arrayed in a layer on a surface of the semiconductor substrate 10 for epitaxial growth of various semiconductor layers. This surface is called top surface and is also called Ga surface or +C polar face. Nitrogen atoms are arrayed in a layer on a nitrogen surface which is the opposite side of the top surface. This surface is called rear surface and is also called N surface or −C polar face. The N surface has the property of consistently appearing on the rear surface of the semiconductor substrate 10 even when the semiconductor substrate 10 is polished from its rear surface side and the thickness of the substrate is reduced to any arbitrary thickness. In a nitride semiconductor substrate having the gallium atoms of the gallium nitride substrate partially replaced by aluminum (Al) atoms or indium (In) atoms, the rear surface is the N surface.

The N surface of a nitride semiconductor substrate such as gallium nitride substrate is more likely to adsorb carbon (C) on its surface. Even after formation of the metal layer on the N surface, carbon is expected to be stably present at an interface between the N surface and the metal layer. This carbon is thought to serve as an electrical barrier at the interface between the N surface and the metal layer.

The process of wet etching performed at step S105 uses a solution containing TMAH (tetramethylammonium hydroxide). The conditions of wet etching are the temperature of the solution of not higher than 60° C. and the time of not shorter than 10 seconds but not longer than 300 seconds. This further reduces the contact resistance between the semiconductor substrate and the metal layer.

At subsequent step S110, the method forms the titanium layer 20 on the N surface (surface on the −X direction side) of the semiconductor substrate 10. The titanium layer 20 is formed by sputtering. Firstly, argon (Ar) gas is supplied in a chamber of a non-oxygen atmosphere and the semiconductor substrate 10 is placed in the chamber. Then, the atomic nucleus of argon plasma is hit against a metal target. The metal target used here is a metal target of releasing titanium. Metal target atoms are then released to fly from the part of the metal target on which the atomic nucleus of argon is applied and deposit on the N surface of the semiconductor substrate 10. The sputtering technique allows for uniform film formation in a short time period over the entire N surface which is the surface on the opposite side (−X direction side) to the pre-treated surface. The "non-oxygen atmosphere" is an atmosphere in which a partial pressure of oxygen is less than 1% of the partial pressure of oxygen in the atmosphere. The conditions of sputtering, for example, RF (radio frequency) power depends on equipment used and should thus be adequately set to optimal conditions. The same applies to formation of other layers by sputtering.

In this process, the metal layer is formed by sputtering at the film formation rate controlled to 4 nm/minute or lower. The process of forming a metal layer by sputtering at the film formation rate controlled to 4 nm/minute or lower is also called first process. The "film formation rate" denotes thickness of deposition of a metal layer per unit time. The film formation rate is controllable by adjusting the electric power applied for sputtering. Increasing the applied power increases the film formation rate, while decreasing the applied power decreases the film formation rate.

Controlling the film formation rate by sputtering to 4 nm/minute or lower reduces the contact resistance between the N surface of the semiconductor substrate 10 and the metal layer. This reduction may be attributed to the following mechanism. Relatively gentle collision of metal atoms against the N surface of the semiconductor substrate 10 reduces the damage on the N surface of the semiconductor substrate 10 by collision of the metal atoms and forms a metal layer with flicking of C present on the N surface. This may result in reducing the contact resistivity between the N surface of the semiconductor substrate 10 and the metal layer. The film formation rate in the first process is preferably set to 0.01 nm/minute or higher. This improves the productivity.

At step S120, the method forms the aluminum layer 30 on the surface (−X direction side surface) of the titanium layer 20. The aluminum layer 30 is formed by sputtering. A metal target used here is a metal target of releasing aluminum, and sputtering is performed in a non-oxygen atmosphere.

At step S130, the method performs heat treatment. The heat treatment of this embodiment is heat treatment performed to reduce the contact resistance between the semiconductor layer 10 and the metal layer (titanium layer 20 and aluminum layer 30). In this embodiment, heat treatment is performed at 400° C. for 30 minutes. The temperature of heat treatment is preferably not lower than 350° C. and not higher than 550° C. This range further reduces the contact resistivity between the N surface of the semiconductor substrate 10 and the metal layer. The semiconductor device 100 of the embodiment is manufactured by the above series of processes.

The manufacturing method of the semiconductor device according to this embodiment reduces the contact resistance between the semiconductor layer 10 and the titanium layer 20 as the metal layer. The process from forming the titanium layer 20 (step S110) to forming the aluminum layer 30 (step S120) is performed in the non-oxygen atmosphere. This prevents oxidation of the layered metals.

B. Performance Evaluation

Figure 3:
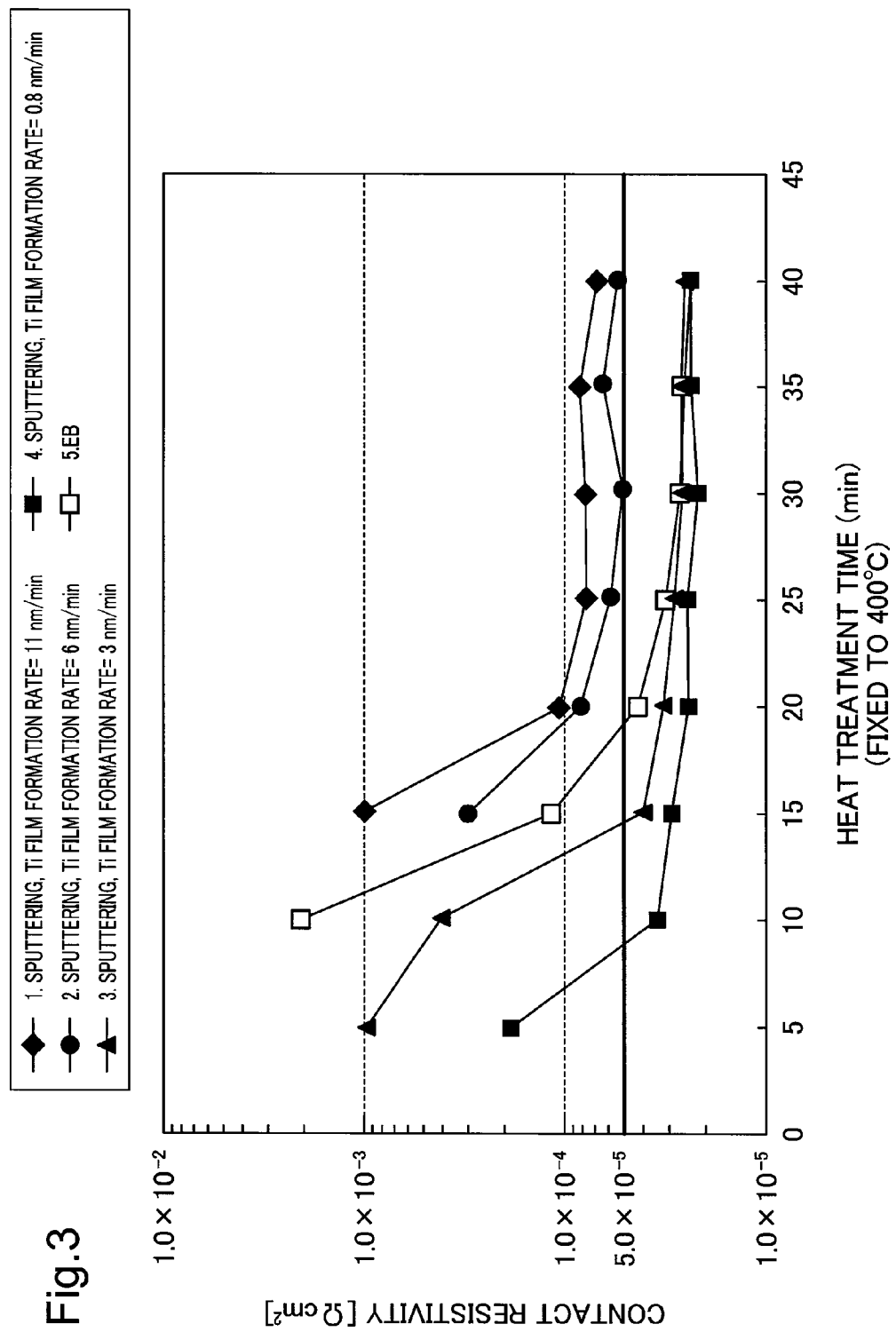
FIG. 3 is a graph showing variations in contact resistivity as a function of heat treatment time with respect to semiconductor devices manufactured under different film forming conditions.

FIG. 3 is a graph showing variations in contact resistivity as a function of heat treatment time with respect to semiconductor devices manufactured under different film forming conditions. This evaluation test was as follows; test samples 1 to 5 were manufactured and the contact resistivities ($\Omega cm^2$) of each test sample with varying the heat treatment time were measured. Each test sample was manufactured by forming a titanium layer of 30 nm on an N surface of a semiconductor substrate, forming an aluminum layer of 300 nm on the titanium layer and subsequently performing heat treatment. The semiconductor substrate used was a gallium nitride substrate. The contact resistivity denotes contact resistivity at the interface between the N surface of the gallium nitride substrate and the metal layer after heat treatment.

Test samples 1 to 4 employed the sputtering deposition technique for film formation, while test sample 5 employed the EB (electron beam) deposition technique. The following gives the film formation rates of test samples 1 to 4:

Test sample 1: film formation rate: 11 nm/min
Test sample 2: film formation rate: 6 nm/min
Test sample 3: film formation rate: 3 nm/min
Test sample 4: film formation rate: 0.8 nm/min The contact resistivity was measured by TLM (transfer contact method). The contact resistivity on the ordinate of FIG. 3 shows the contact resistivity at the interface between the N surface of the gallium nitride substrate and the metal layer. The abscissa of FIG. 3 shows the heat treatment time after formation of the metal layer. The heat treatment temperature is 400° C. and the number of the measured samples for each test is 10.

The results of FIG. 3 show that test samples 3 and 4 having the film formation rate of the titanium layer controlled to 4 nm/minute or lower have the lower contact resistivities, compared with the contact resistivity of test sample 5 having a metal layer formed by the EB deposition technique. For example, in comparison between test samples under the condition of the heat treatment time of 15 minutes, the contact resistivities of test samples 3 and 4 are not higher than $5.0 \times 10^{-5}$ $\Omega cm^2$, while the contact resistivity of test sample 5 is higher than $5.0 \times 10^{-5}$ $\Omega cm^2$. Test samples 1 and 2 have the film formation rate of the titanium layer of higher than 4 nm/minute. The high film formation rate gives the high collision speed of metal atoms and may cause significant damage on the N surface by collision of metal atoms. This may be the reason why the contact resistivities of test samples 1 and 2 are higher than that of test sample 5 employing the EB deposition technique for film formation.

According to the above results, forming the metal layer on the N surface of the nitride semiconductor substrate by sputtering at the film formation rate controlled to 4 nm/minute or lower reduces the contact resistance.

C. Modifications

The invention is not limited to the embodiment described above, but a multiplicity of variations and modifications may be made to the embodiment without departing from the scope of the invention. Some examples of possible modification are given below.

C1. Modification 1

In the above embodiment, the semiconductor layer 10 is provided in advance at step S100. The invention is, however, not limited to this procedure. The semiconductor substrate 10 may be formed immediately before the process of step S110. More specifically, the semiconductor layer 10 may be formed by metal organic chemical vapor deposition (MOCVD).

C2. Modification 2

In the above embodiment, all the metal layers are formed by the sputtering deposition technique. The invention is, however, not limited to this procedure. After the first process, the metal layer may be formed by another deposition technique, for example, electron beam (EB) deposition technique or resistance heating deposition technique or chemical vapor deposition.

C3. Modification 3

The titanium layer is formed in the first process of the above embodiment. The invention is, however, not limited to this procedure. For example, a vanadium (V) layer may be formed. The titanium layer 20 and the aluminum layer 30 are formed on the semiconductor layer 10. The semiconductor device 100 may have a multi-layered structure by additionally forming gold (Au)/nickel (Ni) or copper (Cu)/titanium nitride (TiN) on these metal layers.

C4. Modification 4

In the above embodiment, heat treatment is performed at 400° C. for 30 minutes. The invention is, however, not limited to these conditions. The conditions of heat treatment may be any temperature and any time that ensure the ohmic contact between the semiconductor and the electrode: for example, 450° C. for 30 minutes or 500° C. for 5 minutes.

C5. Modification 5

In the above embodiment, the semiconductor device is SBD. The invention is, however, not limited to this structure. The semiconductor device may be FET (field effect transistor), bipolar transistor, IGBT (insulated gate bipolar transistor) or PIN (p-intrinsic-n) diode.

C6. Modification 6

In the above embodiment, the method forms the metal layer by sputtering at the film formation rate controlled to 4 nm/minute or lower. The invention is, however, not limited to this procedure. A modified procedure may form a metal layer by sputtering at the film formation rate controlled to be higher than 4 nm/minute after the process of forming the metal layer by sputtering at the film formation rate controlled to 4 nm/minute or lower (first process). The process of forming the metal layer by sputtering at the film formation rate controlled to be higher than 4 nm/minute is called second process. Controlling the film formation rate to be higher than 4 nm/minute in the second process improves the productivity.

The film thickness of the metal layer formed in the first process is preferably not less than 3 nm, is more preferably not less than 5 nm and is furthermore preferably not less than 10 nm. This effectively reduces the contact resistance between the semiconductor layer 10 and the metal layer (titanium layer 20).

C7. Modification 7

The above embodiment uses the semiconductor substrate 10 which has been subjected to the pre-treatment for the surface on the opposite side to the surface where the titanium layer 20 and the aluminum layer 30 are formed. The invention is, however, not limited to this procedure. A modified procedure may form the titanium layer 20 and the aluminum layer 30 on the semiconductor layer 10 and subsequently make the other surface of the semiconductor layer 10, which is on the opposite side to the surface where the titanium layer 20 and the aluminum layer 30 are formed, subjected to treatment.

C8. Modification 8

In the above embodiment, the respective layers 20 and 30 are formed over the entire surface (N surface) of the semiconductor substrate 10 on the opposite side (−X direction side) to the surface subjected to the pre-treatment. The invention is, however, not limited to this procedure. The respective layers 20 and 30 may be formed not over the entire N surface of the semiconductor substrate 10 but on only part of the N surface.

C9. Modification 9

In the above embodiment, wet etching is preferably performed using the solution containing TMAH. This may be attributed to the following reason. TMAH does not include metal ions and thereby does not cause metal contamination on the N surface of the gallium nitride substrate. The solution has relatively low temperature of not higher than 60° C. and accordingly has advantages in controllability and yield. The invention is, however, not limited to this procedure. The solution used for wet etching may be, for example, a solution containing sodium hydroxide (NaOH), potassium hydroxide (KOH) or phosphoric acid ($H_3PO_4$).

The invention is not limited to the above embodiment or any of the above examples but may be implemented by any of various other configurations without departing from the scope of the invention. For example, the technical features of the embodiment or the examples corresponding to the technical features of the respective aspects described in Summary may be replaced or combined appropriately, in order to solve part or all of the problems described above or in order to achieve part or all of the advantageous effects described above. Any of the technical features may be omitted appropriately unless the technical feature is described as essential herein.

The invention claimed is:

1. A manufacturing method of a semiconductor device, the method comprising:
    disposing a metal layer on an N surface of a nitride semiconductor substrate,
        wherein the disposing the metal layer includes a first process of forming the metal layer by sputtering at a film formation rate controlled to 4 nm/ minute or lower such that the metal layer is formed with flicking of carbon present on the N surface in a non-oxygen atmosphere and an Ar atmosphere; and
    performing a wet etching on the N surface of the nitride semiconductor substrate, prior to the sputtering,
    wherein the N surface includes a nitrogen surface,
    wherein, in the nitride semiconductor substrate, the N surface is located on an opposite side of a surface that is arranged for epitaxial growth, and
    wherein the film formation rate is controlled by an applied voltage.

2. The manufacturing method of the semiconductor device according to claim 1, wherein the film formation rate in the first process is equal to or higher than 0.01 nm/minute.

3. The manufacturing method of the semiconductor device according to claim 1, wherein the nitride semiconductor substrate mainly comprises gallium nitride.

4. The manufacturing method of the semiconductor device according to claim 1, wherein the first process includes a process of forming a layer comprising titanium.

5. The manufacturing method of the semiconductor device according to claim 4, wherein the disposing the metal layer includes a process of forming a layer mainly comprising aluminum, after the process of forming the layer comprising titanium.

6. The manufacturing method of the semiconductor device according to claim 1, wherein the wet etching is performed using a solution containing tetramethylammonium hydroxide (TMAH).

7. The manufacturing method of the semiconductor device according to claim 1, wherein the wet etching is performed using a solution having a temperature of not higher than 60° C.

8. The manufacturing method of the semiconductor device according to claim 1, wherein the wet etching is performed for a time of not shorter than 10 seconds.

9. The manufacturing method of the semiconductor device according to claim 1, wherein the wet etching is performed for a time of not longer than 300 seconds.

10. The manufacturing method of the semiconductor device according to claim 1, further comprising:
performing a heat treatment, after the disposing the metal layer.

11. The manufacturing method of the semiconductor device according to claim 10, wherein the heat treatment is performed at a temperature of not lower than 350° C. and not higher than 550° C.

12. The manufacturing method of the semiconductor device according to claim 1, wherein the disposing the metal layer includes a second process of forming the metal layer by sputtering at a film formation rate controlled to be higher than 4 nm/ minute, after the first process.

13. The manufacturing method of the semiconductor device according to claim 1, wherein the disposing the metal layer on the N surface of the nitride semiconductor substrate comprises directly disposing the metal layer on the N surface of the nitride semiconductor substrate that is exposed.

14. The manufacturing method of the semiconductor device according to claim 1, wherein the metal layer abuts the N surface of the nitride semiconductor substrate.

15. The manufacturing method of the semiconductor device according to claim 1, wherein the disposing the metal layer comprises:
disposing a first metal layer comprising titanium on the N surface of the nitride semiconductor substrate.

16. The manufacturing method of the semiconductor device according to claim 15, wherein the disposing the metal layer further comprises:
disposing a second metal layer comprising aluminum on a surface of the first metal layer.

17. A manufacturing method of a semiconductor device, the method comprising:
disposing a metal layer on an exposed N surface of a nitride semiconductor substrate,
wherein the disposing the metal layer includes sputtering at a controlled film formation rate such that the metal layer is formed with flicking of carbon present on the N surface in a non-oxygen atmosphere and an Ar atmosphere; and
performing a wet etching on the N surface of the nitride semiconductor substrate, prior to the sputtering,
wherein the N surface includes a nitrogen surface,
wherein, in the nitride semiconductor substrate, the N surface is located on an opposite side of a surface that is arranged for epitaxial growth, and
wherein the film formation rate is controlled by an applied voltage.

18. The manufacturing method of the semiconductor device according to claim 17, wherein the film formation rate is 4 nm/ minute or lower, and
wherein the metal layer abuts the exposed surface of the nitride semiconductor substrate.

19. The manufacturing method of the semiconductor device according to claim 18, wherein the disposing the metal layer comprises:
disposing a first metal layer comprising titanium on the exposed surface of the nitride semiconductor substrate; and
disposing a second metal layer comprising aluminum on a surface of the first metal layer.

20. The manufacturing method of the semiconductor device according to claim 1, wherein the N surface includes a −C polar surface.

21. The manufacturing method of the semiconductor device according to claim 1, wherein nitrogen atoms are arrayed in a layer on the N surface.

22. The manufacturing method of the semiconductor device according to claim 1, wherein the metal layer extends from an edge of the N surface of the nitride semiconductor substrate to another edge of the N surface of the nitride semiconductor substrate.

* * * * *